(12) United States Patent
Wu et al.

(10) Patent No.: US 8,525,262 B2
(45) Date of Patent: Sep. 3, 2013

(54) TRANSISTOR WITH BURIED FINS

(75) Inventors: Tieh-Chiang Wu, Taoyuan County (TW); Yi-Nan Chen, Taipei (TW); Hsien-Wen Liu, Taoyuan County (TW)

(73) Assignee: Nanya Technology Corp., Kueishan, Tao-Yuan Hsien (TW)

(*) Notice: Subject to any disclaimer, the term of this patent is extended or adjusted under 35 U.S.C. 154(b) by 148 days.

(21) Appl. No.: 13/081,509

(22) Filed: Apr. 7, 2011

(65) Prior Publication Data

US 2012/0256257 A1  Oct. 11, 2012

(51) Int. Cl.
*H01L 27/12* (2006.01)

(52) U.S. Cl.
USPC .......................................... 257/347; 257/353

(58) Field of Classification Search
USPC .................... 257/347, 353, E27.212
See application file for complete search history.

(56) References Cited

U.S. PATENT DOCUMENTS 5,270,257 A * 12/1993 Shin .............................. 438/300
2008/0102570 A1 * 5/2008 Fischer et al. ................ 438/157

* cited by examiner

*Primary Examiner* — Long Pham
*Assistant Examiner* — Steven Rao
(74) *Attorney, Agent, or Firm* — Winston Hsu; Scott Margo

(57) ABSTRACT

The present invention disclosed a recessed gate transistor with buried fins. The recessed gate transistor with buried fins is disposed in an active region on a semiconductor substrate. Two isolation regions disposed in the semiconductor substrate, and sandwich the active region. A gate structure is disposed in the semiconductor substrate, wherein the gate structure includes: an upper part and a lower part. The upper part is disposed in the active region and a lower part having a front fin disposed in one of the two isolation regions, at least one middle fin disposed in the active region, and a last fin disposed in the other one of the two isolation regions, wherein the front fin are both elliptic cylindrical.

12 Claims, 7 Drawing Sheets

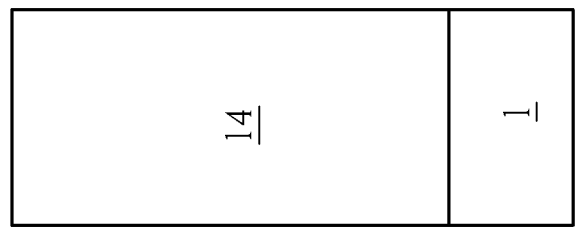
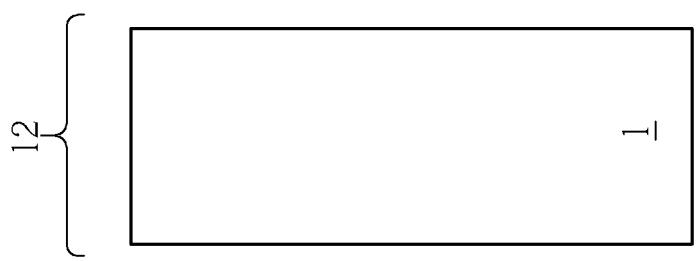
FIG. 3
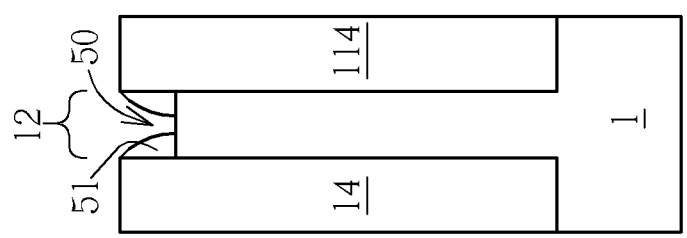

TRANSISTOR WITH BURIED FINS

BACKGROUND OF THE INVENTION

1. Field of the Invention

The information disclosed herein relates generally to a recessed gate transistor, and more particularly to a recessed gate transistor with buried fins.

2. Description of the Prior Art

Techniques for the manufacture and production of semiconductor devices are being developed worldwide, based on requirements of semiconductor users and semiconductor manufacturers. Thus, designing to integrate more semiconductor devices in a semiconductor chip of limited size reduces an interval between gates, causing a short channel effect, a leakage current, and other difficulties.

In order to solve these shortcomings, it is well known in the art of a recessed gate transistor is provided. The recessed gate transistor has a gate insulation layer formed on both side walls and bottom face of a recess formed in a substrate, and a conductive layer, such as polysilicon, fills in the recess.

However, according to the related art, a leakage is generated by a concentration of an electric field because only a thin oxide layer is interposed between the active region and the gate. This, in effect, extends the contact region between the active region and the gate. This causes an increased load capacity and gate induced drain leakage (GIDL). These problems may deteriorate the operating performance of the devices.

SUMMARY OF THE INVENTION

In one aspect, this present invention provides a recessed gate transistor with buried fins to solve problems for gate induced drain leakage, and increase the performance of the recessed gate transistor.

In accordance with the present invention, a recessed gate transistor with buried fins, includes a semiconductor substrate with an active region therein, two isolation regions disposed in the semiconductor substrate, and sandwich the active region, a gate structure disposed in the semiconductor substrate, wherein the gate structure comprises: an upper part disposed in the active region and a lower part having a front fin, at least one middle fin and a last fin. The front fin is disposed in one of the two isolation regions, the middle fin is disposed in the active region, and the last fin is disposed in the other one of the two isolation regions, wherein the front fin and the last fin are both elliptic cylindrical, a source doping region disposed in the active region at one side of the gate structure and a drain doping region disposed in the active region at the other side of the gate structure.

The three fins are buried in the semiconductor substrate. Their rounded bottoms form a concave and convex surface for the gate structure, and therefore numerous channels can be formed and the transistor is turned on. As a result, the performance of the transistor can be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 to FIG. 7 are schematic, cross-sectional diagrams showing the process steps for forming the recessed gate transistor with buried fins according to this invention.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
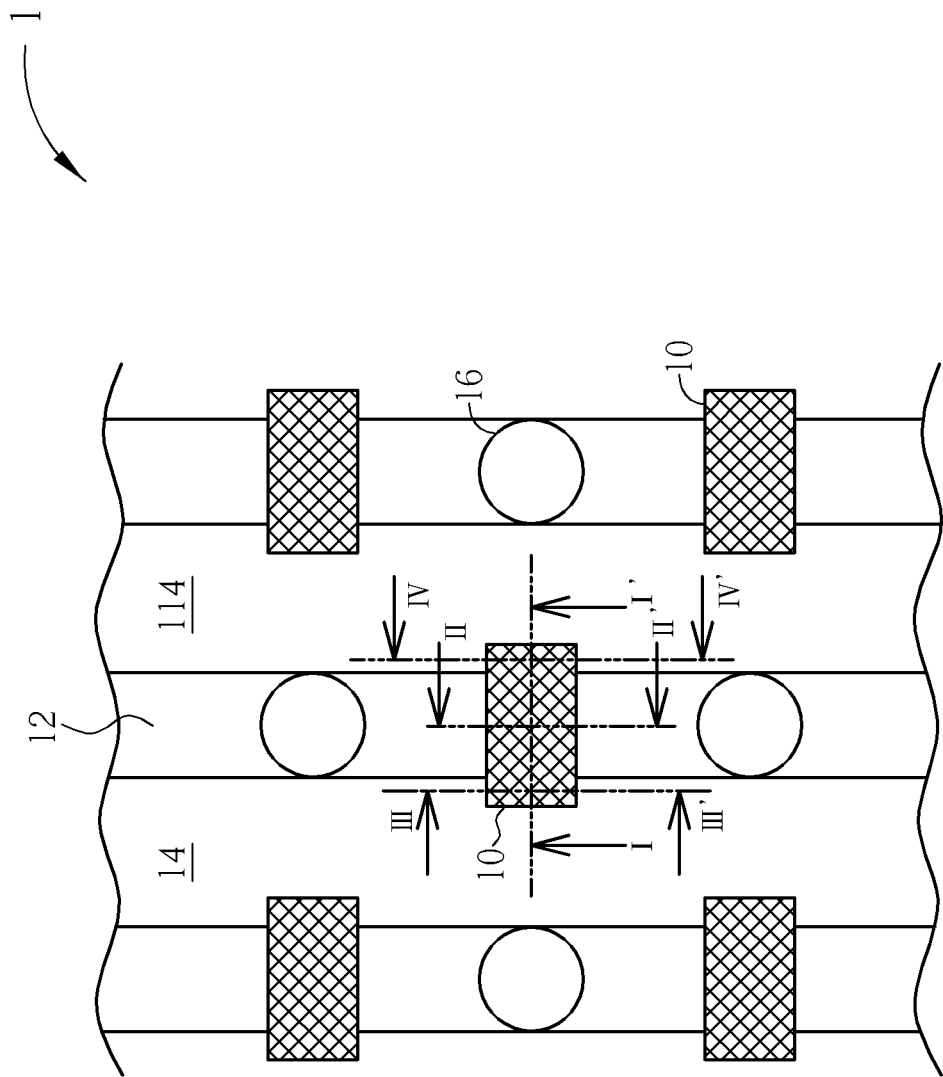
FIG. 1 is a top view illustrating a layout of a recessed gate transistor consistent with the present invention.
Figure 2:
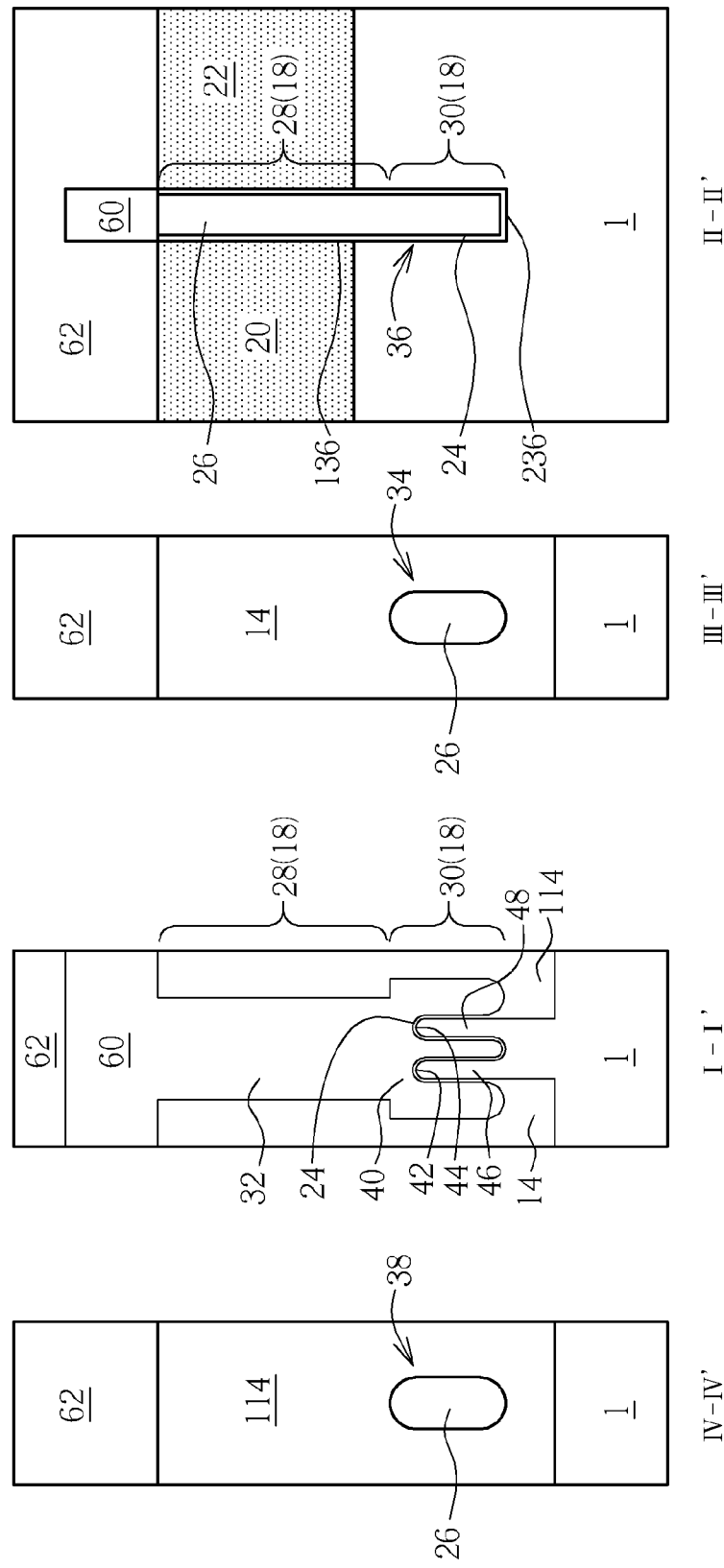
FIG. 2 are cross-sectional views taken along line lines I-I', II-II', III-III' and IV-IV' of FIG. 1, respectively.

FIG. 1 is a top view illustrating a layout of a capacitor DRAM array and a recessed gate transistor consistent with the present invention. FIG. 2 are cross-sectional views taken along line lines I-I', II-II', III-III' and IV-IV' of FIG. 1, respectively.

As shown in FIGS. 1 and 2, a recessed gate transistor with buried fins 10 is disposed in a semiconductor substrate 1. Two isolation structures such as shallow trench isolations 14, 114 that define an active region 12 are formed in the semiconductor substrate 1.

A capacitor structure 16 is disposed in close proximity to the recessed gate transistor 10 constitute a memory cell unit.

Please refer to both FIG. 1 and FIG. 2, the recessed gate transistor 10 comprises a gate structure 18, a source doping region 20, a drain doping region 22. The gate structure 18 includes a gate oxide layer 24, and a gate conductor 26. The gate conductor 26 can be made of polysilicon, metals or combinations thereof. The gate structure 18 includes two parts, an upper part 28 and a lower part 30. The upper part 28 is disposed in the semiconductor substrate 1 in the active region 12. The upper part 28 has a vertical sidewall 32.

The lower part 30 has at least three fins, a front fin 34, at least one middle fin 36 and a last fin 38. The front fin 34 is disposed in one of the two isolation regions 14, 114, for example, the isolation region 14. The last fin 38 is disposed in the other one of the two isolation regions 14, 114, for example, the isolation region 114. The at least one middle fin 36 is disposed in semiconductor substrate 1 within the active region 12. According to the preferred embodiment of the present invention, the number of the middle fin 36 is one, but not limited to it. The number of the middle fin 36 can be more than one. It is noteworthy that the front fin 34 and the last fin 38 are symmetric. The front fin 34 and the last fin are both in a shape of elliptic cylinder. Preferably, the middle fin 36 has a vertical 136 sidewall and a square bottom 236. Because of the at least three fins 34, 36, 38, the lower part 30 of the gate structure 18 form a concave and convex bottom.

The source doping region 20 is disposed in the semiconductor substrate 1 within the active region 12 at one side of the gate structure 18. The drain doping region 22 is disposed in the semiconductor substrate 1 within the active region 12 at the other side of the gate structure 18.

Please refer to FIG. 2, in the cross-sectional view taken along lines I-I', the lower part 30 further comprises joint elements 40 connect the front fin 34 to the middle fin 36 next to the front fin 34, and connect to the last fin 38 to the middle fin 36 next to the last fin 38. Furthermore, the front fin 34 and the middle fin 36 next to the front fin 34 define a first recessed region 42, and the last fin 38 and the middle fin 36 next to the last fin 38 define a second recessed region 44. The semiconductor substrate 1 in the active region 12 has a first protrusion 46 and a second protrusion 48. The first protrusion 46 engages with the first recessed region 42, and the second protrusion 48 engages with the second recessed region 44. In other words, the front fin 34 and the middle fin 36 next to the front fin 34 sandwich the first protrusion 46, and the last fin 38 and the middle fin 36 next to the last fin 38 sandwich the second protrusion 48.

Moreover, it should be noted that the lower part 30 of the gate structure 18 is M-shaped when view from the source doping region 20 to the drain doping region 22 direction.

Furthermore, a word line 60 can be disposed on the gate structure 18, and an insulation layer 62 can cover the word line 60 and the STIs 14, 114.

Please refer to FIG. 3 to FIG. 7. FIG. 3 to FIG. 7 are schematic, cross-sectional diagrams showing the process steps for forming the recessed gate transistor with buried fins according to this invention, wherein the I-I' cross-section, II-II' cross-section, and III-III' cross-section are presented in each figure and like numeral numbers designate like elements, regions or layers. Because IV-IV' cross-section is symmetric to III-III' cross-section, IV-IV' cross-section is omitted in the diagram.

Figure 4:
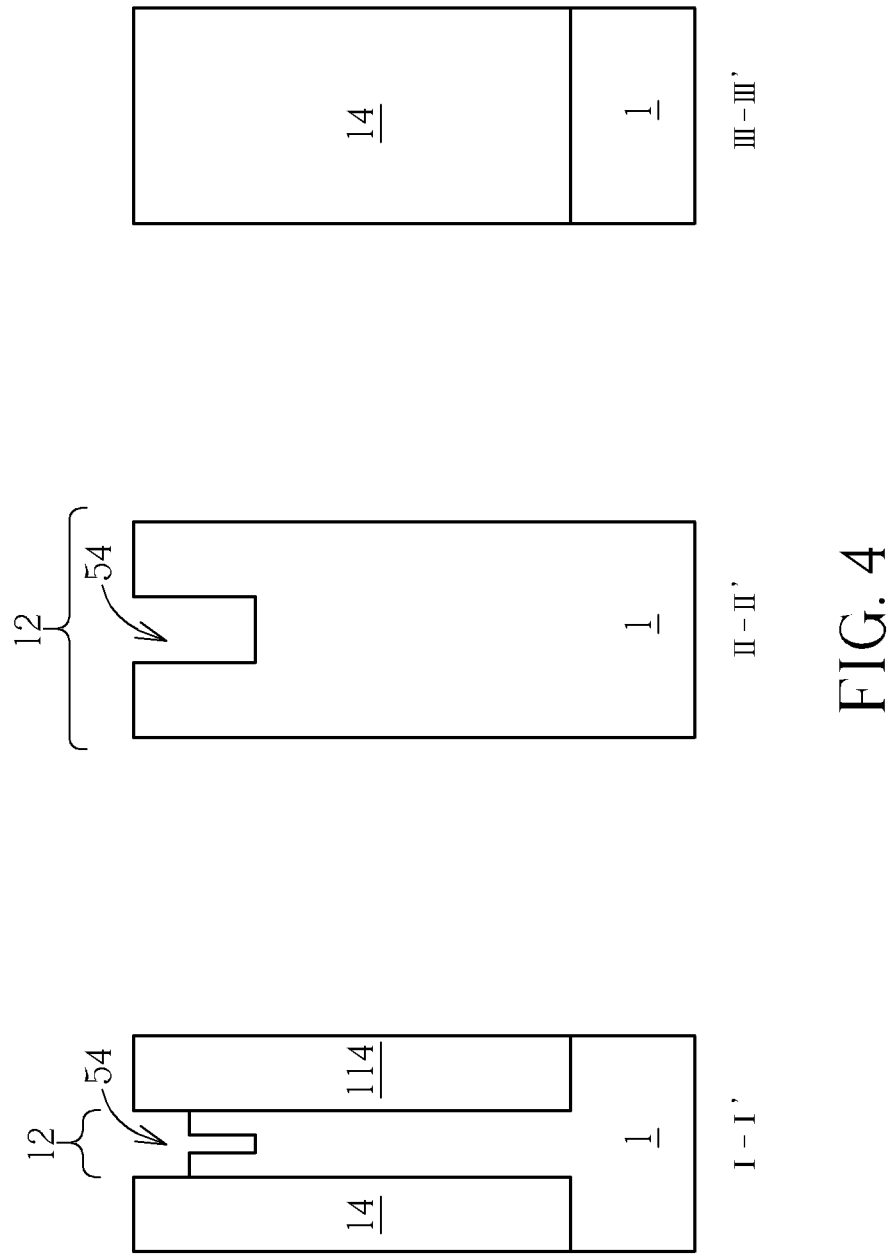
Figure 5:
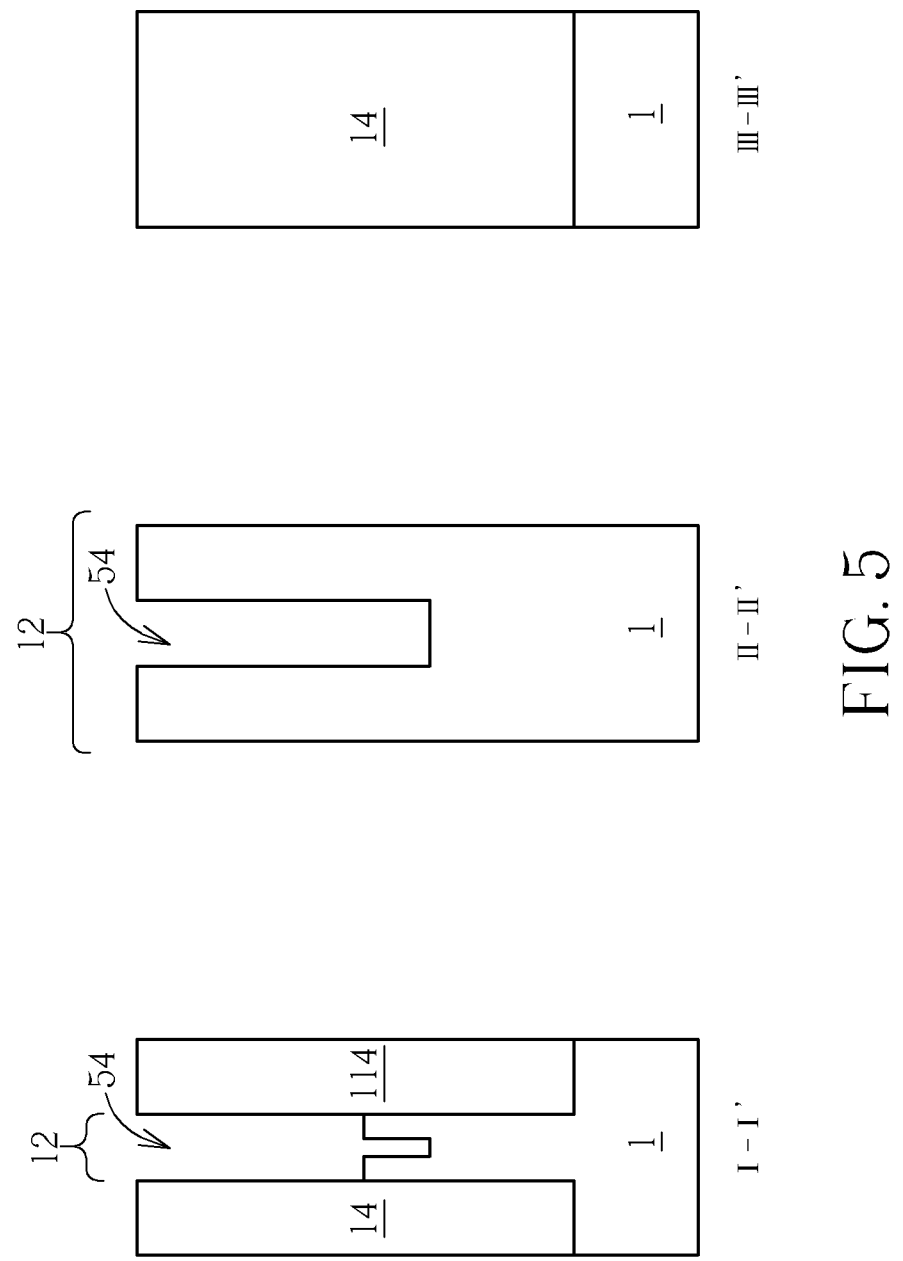
Figure 6:
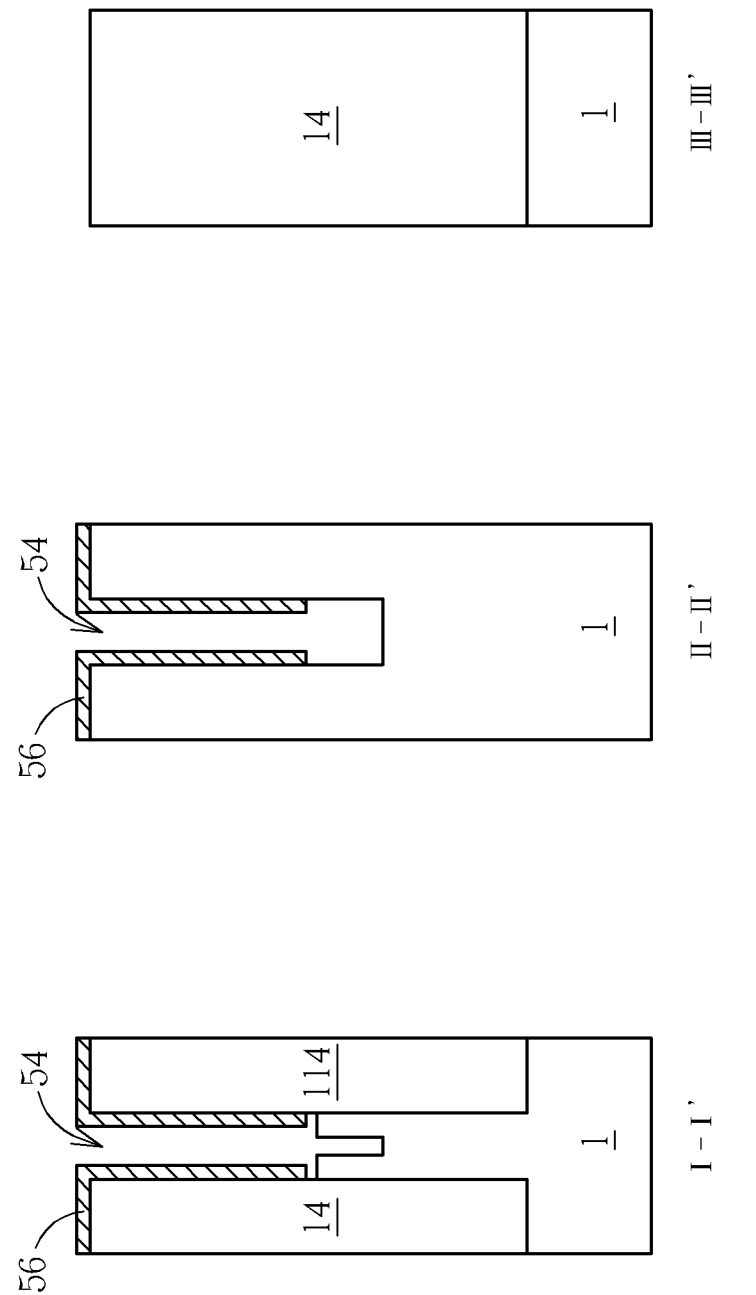
Figure 7:
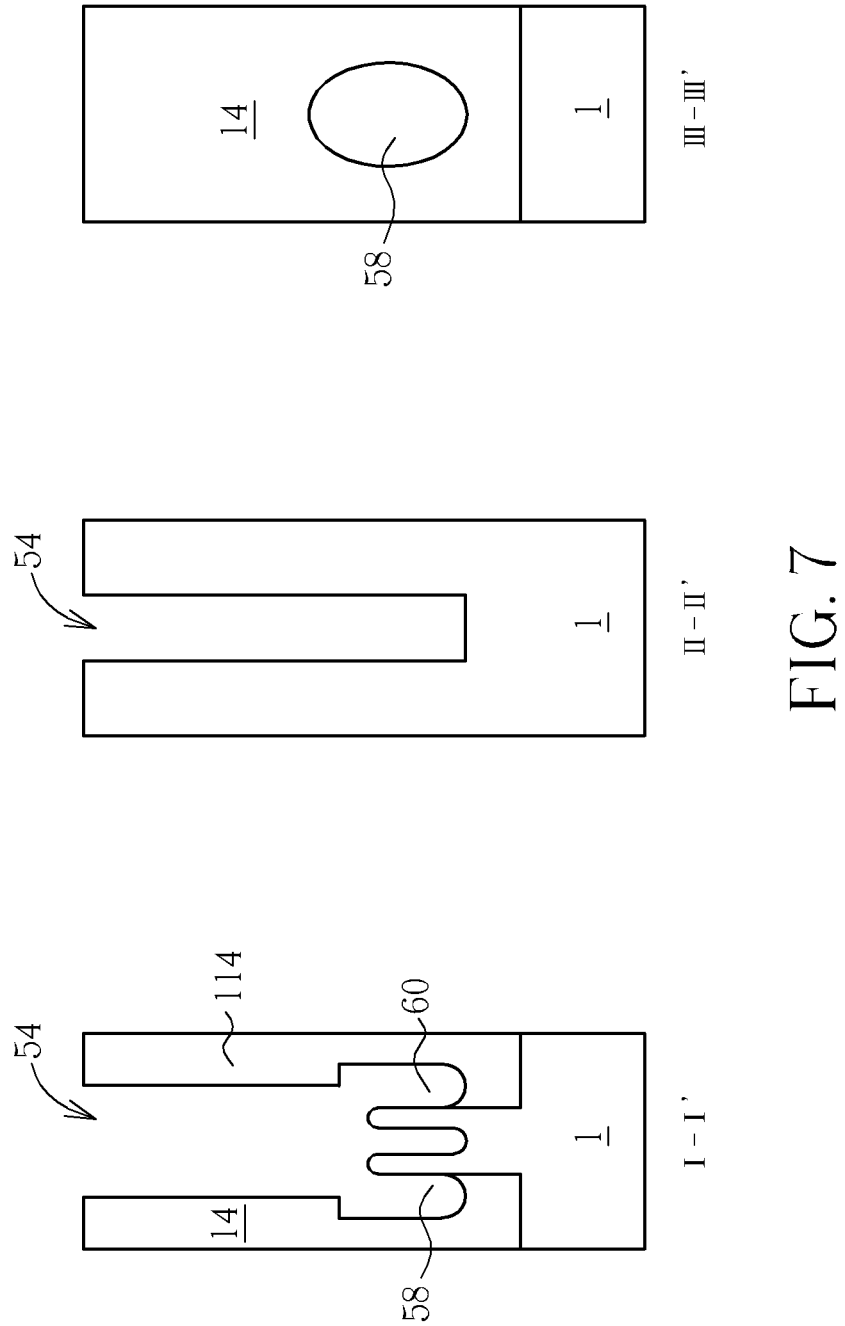

As shown in FIG. 3, a semiconductor substrate 1 has two STIs 14, 114 is provided. An active region 12 is defined between the STIs 14, 114. Then, a trench 50 is formed in the active region 12 between the STIs 14, 114. Later, a spacer 51 is formed on two sidewalls of the trench 50. As shown in FIG. 4, the active region 12 of semiconductor substrate 1 is etched by taking the spacer 51 as a mask so as to form a trench 54. Then, as shown in FIG. 5, the spacer 51 is removed. After that, the exposed semiconductor substrate 1 is etched isotropically to make the trench 54 become deeper. As shown in FIG. 6, a mask layer 56 is formed on a upper portion of the trench 54. Subsequently, as set forth in FIG. 7, the mask layer 56 is removed. Then, another etching process is performed to etch the STIs 14, 114 so as to form elliptic cylindrical recesses 58, 60 in the STIs 14, 114.

Later, a gate oxide layer and a gate conductor can be formed in the trench 54, and the recesses 58, 60. Then, a source doping region, and a drain doping region can be formed in the active region 12 to complete a recessed gate transistor.

Because the lower part of the gate structure has a concave and convex bottom, the more channels can be formed. Furthermore, the structure of fins can prevent the GIDL problem.

The above embodiments consistent with the present invention are illustrative and not limitative. Various alternatives and equivalents are possible. The invention is not limited by the types of deposition, etching, polishing, and patterning steps described herein. Nor is the invention limited to any specific types of semiconductor devices. For example, the present invention may be implemented in a dynamic random access memory (DRAM) device or in a non-volatile memory device. Other additions, subtractions, or modifications are obvious in view of the present disclosure and are intended to fall within the scope of the appended claims.

Those skilled in the art will readily observe that numerous modifications and alterations of the device and method may be made while retaining the teachings of the invention.

What is claimed is:

1. A recessed gate transistor with buried fins, comprising:
   a semiconductor substrate having an active region therein;
   two isolation regions disposed in the semiconductor substrate, and sandwich the active region;
   a gate structure disposed in the semiconductor substrate, wherein the gate structure comprises:
      an upper part disposed in the active region; and
      a lower part having a front fin disposed in one of the two isolation regions, at least one middle fin disposed in the active region, and a last fin disposed in the other one of the two isolation regions, wherein the front fin and the last fin are both elliptic cylindrical, and the upper part electrically connects to the middle fin;
   a source doping region disposed in the active region at one side of the gate structure; and
   a drain doping region disposed in the active region at the other side of the gate structure.

2. The recessed gate transistor with buried fins of claim 1, wherein the front fin is symmetric to the last fin.

3. The recessed gate transistor with buried fins of claim 1, wherein the lower part further comprises a joint element connects the front fin to the middle fin next to the front fin.

4. The recessed gate transistor with buried fins of claim 1, wherein the lower part further comprises a joint element connects the last fin to the middle fin next to the last fin.

5. The recessed gate transistor with buried fins of claim 1, the front fin and the middle fin next to the front fin define a first recessed region, and the last fin and the middle fin next to the last fin define a second recessed region.

6. The recessed gate transistor with buried fins of claim 5, wherein the semiconductor substrate in the active region has a first protrusion and a second protrusion.

7. The recessed gate transistor with buried fins of claim 6, wherein the first protrusion engages with the first recessed region, and the second protrusion engages with the second recessed region.

8. The recessed gate transistor with buried fins of claim 6, wherein the front fin and the middle fin next to the front fin sandwich the first protrusion.

9. The recessed gate transistor with buried fins of claim 6, wherein the last fin and the middle fin next to the last fin sandwich the second protrusion.

10. The recessed gate transistor with buried fins of claim 1, wherein the upper part of the gate structure comprises a vertical sidewall.

11. The recessed gate transistor with buried fins of claim 1, wherein the lower part of the gate structure has a concave and convex bottom.

12. The recessed gate transistor with buried fins of claim 1, wherein the lower part of the gate structure is M-shaped when view from the source doping region to the drain doping region direction.

* * * * *